(12) United States Patent
Katsuragi

(10) Patent No.: US 10,756,742 B1
(45) Date of Patent: Aug. 25, 2020

(54) CLOCK RECOVERY CIRCUIT AND RECEIVING DEVICE

(71) Applicant: Toshiba Memory Corporation, Tokyo (JP)

(72) Inventor: Makihiko Katsuragi, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/552,067

(22) Filed: Aug. 27, 2019

(30) Foreign Application Priority Data

Feb. 27, 2019 (JP) .................................. 2019-034403

(51) Int. Cl.
| | |
|---|---|
| *H03L 7/08* | (2006.01) |
| *H03L 7/091* | (2006.01) |
| *H04L 7/08* | (2006.01) |
| *H03L 7/14* | (2006.01) |
| *H04L 7/033* | (2006.01) |

(52) U.S. Cl.
CPC ............ *H03L 7/143* (2013.01); *H03L 7/0807* (2013.01); *H04L 7/0331* (2013.01)

(58) Field of Classification Search
CPC combination set(s) only.
See application file for complete search history.

(56) References Cited

U.S. PATENT DOCUMENTS

| | | | |
|---|---|---|---|
| 7,076,377 B2 * | 7/2006 | Kim ...................... | H03L 7/0814 375/355 |
| 8,570,078 B2 | 10/2013 | Sato | |
| 9,565,015 B1 | 2/2017 | Tsunoda | |
| 10,367,634 B1 * | 7/2019 | Yu ......................... | H04L 7/0016 |
| 2013/0076412 A1 | 3/2013 | Shirai | |

FOREIGN PATENT DOCUMENTS

| | | |
|---|---|---|
| JP | 2013-070254 A | 4/2013 |
| JP | 2013-070323 A | 4/2013 |
| JP | 2017-055251 A | 3/2017 |

* cited by examiner

*Primary Examiner* — An T Luu
(74) *Attorney, Agent, or Firm* — Kim & Stewart LLP

(57) ABSTRACT

A clock recovery circuit includes a multi-phase sampling circuit, a phase comparison circuit, a recovery clock generation circuit, and a phase shifter. The multi-phase sampling circuit includes edge samplers and data samplers. A data signal is input to each of the edge samplers and each of the data samplers. The phase comparison circuit is disposed at an output side of the multi-phase sampling circuit. The recovery clock generation circuit is configured to output multi-phase clock signals. The phase shifter is disposed between the recovery clock generation circuit and the multi-phase sampling circuit and configured to generate a plurality of clock signals to be supplied to the multi-phase sampling circuit by shifting a phase of a first one of the multi-phase clock signals output from the recovery clock generation circuit by a shift amount different from a shift amount of a second one of the multi-phase clock signals.

20 Claims, 9 Drawing Sheets

FIG. 4

| Edge [0] <br> (TIMING BY CKS[0]) <br> tE[0°] | Data [0] <br> (TIMING BY CKS[1]) <br> tD[Δφ] | Data [1] <br> (TIMING BY CKS[3]) <br> tD[180−Δφ] | Edge [1] <br> (TIMING BY CKS[2]) <br> tE[180°] | DETERMINATION RESULT OR DETECTION RESULT |
|---|---|---|---|---|
| 0 | 1 | 1 | 1 | PD='Early' |
| 1 | 1 | 1 | 0 | PD='Late' |
| 0 | 0 | 0 | 1 | PD='Late' |
| 1 | 0 | 0 | 0 | PD='Early' |
| 1 | 1 | 0 | 0 | FL='LOCK ERROR' |
| 0 | 0 | 1 | 1 | FL='LOCK ERROR' |

FIG. 6

| Edge [0] $\begin{pmatrix} \text{TIMING BY CKS[0]} \\ tE[0°] \end{pmatrix}$ | Data [0] $\begin{pmatrix} \text{TIMING BY CKS[1]} \\ tD[90°] \end{pmatrix}$ | Edge [1] $\begin{pmatrix} \text{TIMING BY CKS[2]} \\ tE[180°] \end{pmatrix}$ | DETERMINATION RESULT |
|---|---|---|---|
| 0 | 1 | 1 | PD='Early' |
| 1 | 1 | 0 | PD='Late' |
| 0 | 0 | 1 | PD='Late' |
| 1 | 0 | 0 | PD='Early' |

US 10,756,742 B1

CLOCK RECOVERY CIRCUIT AND RECEIVING DEVICE

CROSS-REFERENCE TO RELATED APPLICATION(S)

This application is based upon and claims the benefit of priority from Japanese Patent Application No. 2019-034403, filed Feb. 27, 2019, the entire contents of which are incorporated herein by reference.

FIELD

Embodiments described herein relate generally to a clock recovery circuit and a receiving device.

BACKGROUND

A receiving device including a clock recovery circuit recovers a clock for acquiring data from a received signal. In this case, it is required that the clock needs to be recovered appropriately.

DESCRIPTION OF THE DRAWINGS

FIG. 4 is a table for explaining a determination operation and a lock error detection operation in an oversampling mode in an embodiment.

FIG. 6 is a table for explaining a determination operation in a normal mode in an embodiment.

DETAILED DESCRIPTION

Embodiments provide a clock recovery circuit and a receiving device which are capable of appropriately recovering a clock.

According to an embodiment, a clock recovery circuit includes a multi-phase sampling circuit, a phase comparison circuit, a recovery clock generation circuit, and a phase shifter circuit. The multi-phase sampling circuit includes a plurality of edge samplers and a plurality of data samplers. A data signal is input to each of the plurality of edge samplers and each of the plurality of data samplers. The phase comparison circuit is disposed at an output side of the multi-phase sampling circuit. The recovery clock generation circuit is disposed at an output side of the phase comparison circuit and configured to output multi-phase clock signals. The phase shifter circuit is disposed between the recovery clock generation circuit and the multi-phase sampling circuit and configured to generate a plurality of clock signals to be supplied to the multi-phase sampling circuit by shifting a phase of a first one of the multi-phase clock signals output from the recovery clock generation circuit by a shift amount different from a shift amount of a second one of the multi-phase clock signals.

Hereinafter, a clock recovery circuit according to an embodiment will be described in detail with reference to the accompanying drawings. In addition, the present disclosure is not limited by the embodiment.

Embodiment

Figure 1:
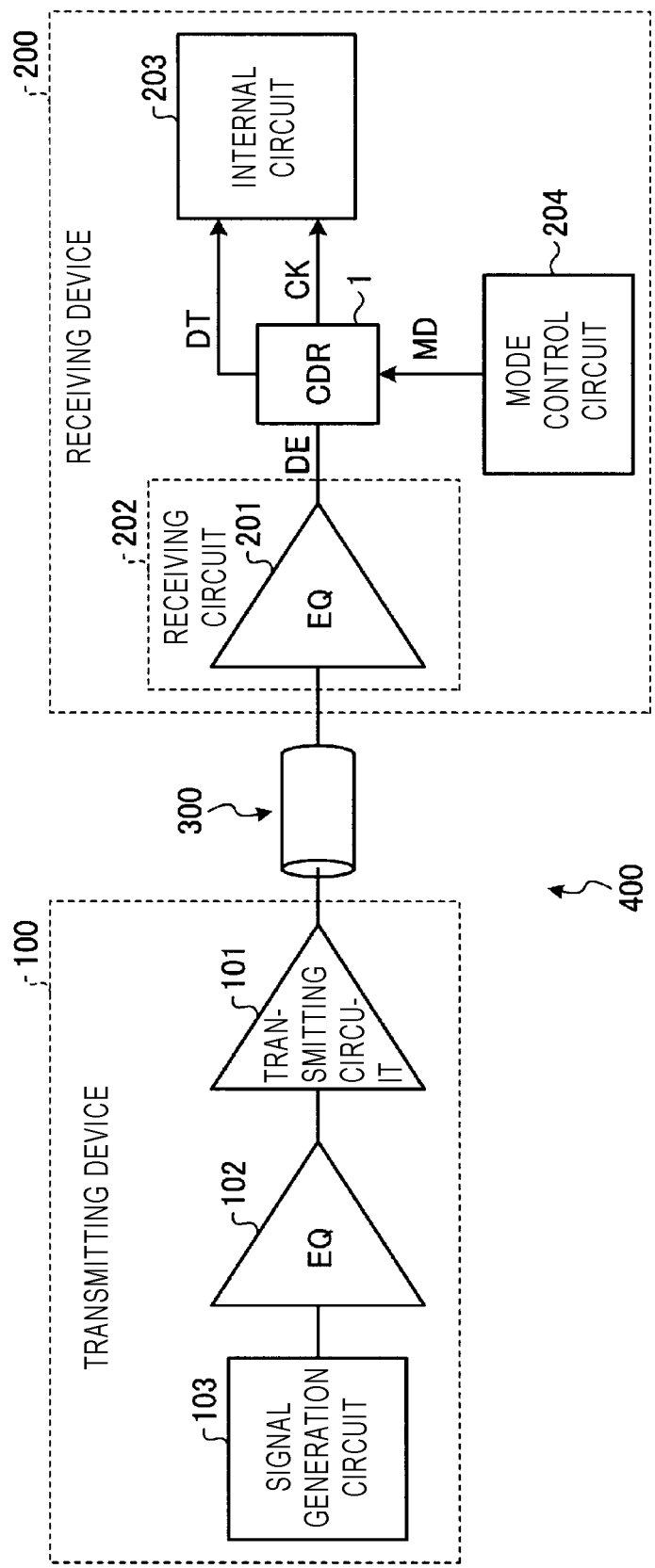
FIG. 1 is a diagram illustrating a communication system including a CDR circuit (clock recovery circuit) and a receiving device according to an embodiment.

A receiving device according to an embodiment is applicable to a communication system that performs a wired communication and may be applied to, for example, a communication system 400 illustrated in FIG. 1. FIG. 1 is a block diagram illustrating a configuration of a communication system 400 including a receiving device 200 according to an embodiment. The communication system 400 includes a transmitting device 100, a receiving device 200, and a transmission path 300.

The transmitting device 100 and the receiving device 200 are connected to communicate with each other through the transmission path 300. The transmitting device 100 includes a transmitting circuit 101, an equalizer (EQ) circuit 102, and a signal generation circuit 103. The signal generation circuit 103 generates a modulation signal modulated to embed information of a clock in transmission data and supplies the generated modulation signal to the equalizer circuit 102. The equalizer circuit 102 generates a transmission signal obtained by performing an equalization on the modulation signal with a particular compensation amount and supplies the generated transmission signal to the transmitting circuit 101. The transmitting circuit 101 transmits the transmission signal to the receiving device 200 via the transmission path 300.

The receiving device 200 includes a receiving circuit 202, a clock data recovery (CDR) circuit 1, an internal circuit 203, and a mode control circuit 204. The receiving circuit 202 receives the transmission signal from the transmitting device 100 via the transmission path 300. The receiving circuit 202 includes an equalizer circuit 201. The equalizer circuit 201 generates a demodulation signal obtained by equalizing the transmission signal with a particular compensation amount. The transmission signal may be degraded due to attenuation characteristics of the transmission path 300. The equalizer circuit 201 supplies the equalized demodulation signal to the CDR circuit 1 as a data signal DE. The CDR circuit 1 recovers a clock (recovery clock) CK from information included in the data signal DE and outputs the recovered recovery clock CK to the internal circuit 203. Further, the CDR circuit 1 outputs data DT obtained by a sampling in the CDR circuit 1 to the internal circuit 203. The internal circuit 203 may perform a given operation by using the recovery clock CK and the data DT.

In response to receiving the data signal DE, the CDR circuit 1 samples a value of an edge portion and a value of a data portion in the data signal DE based on a given clock. The CDR circuit 1 determines whether a phase of the recovery clock CK is advanced or delayed according to a pattern of a sampling result, and adjusts the phase of the recovery clock CK with respect to the data signal DE according to a determination result. The CDR circuit 1 may lock a phase relationship between the data signal DE and the recovery clock CK in a state where an edge sampling timing (i.e., a timing of sampling the value of the edge portion)

matches the edge portion of the data signal DE, and the phase of the recovery clock CK is appropriately adjusted. Therefore, the CDR circuit 1 may recover the recovery clock CK embedded in the data signal DE.

The CDR circuit 1 may be configured using a binary output phase comparator with a simple configuration according to a demand for low costs. In this case, when equalization characteristics of the equalizer circuit 201 have a peak in a high-frequency region according to a frequency characteristic of the transmission path 300, the equalization by the equalizer circuit 201 may be over-equalized. As a result, an eye pattern waveform of the data signal DE input to the CDR circuit 1 from the equalizer circuit 201 may be split in a time-axis direction. A phase comparison result by the binary output phase comparator used in the CDR circuit 1 does not include information of a phase difference. Accordingly, if the waveform of the data signal DE and the split waveform which are adjacent to each other in time are consecutively sampled, a determination result of the phase of the recovery clock CK according to a sampling result of the edge portions which are adjacent to each other in time, of the two waveforms (the waveform of the data signal DE and the split waveform) may be reversed. That is, if a determination of advance (Early) and a determination of delay (Late) are alternately repeated in time, a lock error where the phase relationship between the data signal DE and the recovery clock CK is locked in a state where the edge sampling timing does not match the edge portion of the data signal DE, may occur. If the lock error occurs, it is difficult to appropriately recover the recovery clock CK.

Meanwhile, there might be a consideration that the CDR circuit 1 is implemented by an oversampling type CDR, instead of the binary output phase comparator. In this case, the lock error may be avoided by searching the phase of an optimal sampling clock according to a transition. However, since a circuit for generating a high-speed or multi-phase clock and a sampler are provided, a circuit dimension may easily increase and costs may increase. Further, since a load capacity of a high-speed signal path increases, a power consumption may easily increase.

In contrast, in the embodiment, in the CDR circuit 1, phases of some clocks among multi-phase clocks including a plurality of clocks having different phases from each other are shifted by shift amounts different from the other clocks to intentionally oversample the data signal. Therefore, it may be possible to appropriately recover the recovery clock CK while reducing the costs and the power consumption.

Specifically, an oversampling mode and a normal operation mode are provided as an operation mode of the CDR circuit 1. The receiving device 200 switches the operation mode of the CDR circuit 1 to the oversampling mode during a time period in which an initial setting is performed, for example, at the time of startup of the receiving device 200. As a result, the CDR circuit 1 intentionally oversamples the data portion by shifting some clocks among the multi-phase clocks by shift amounts different from the other clocks. In response to detecting the lock error, the CDR circuit 1 changes the phase shift amount of each clock or resets the circuit for generating the multi-phase clocks. By this processing, when the CDR circuit 1 becomes an appropriately lockable state, the receiving device 200 switches the operation mode of the CDR circuit 1 from the oversampling mode to the normal mode.

More specifically, the receiving device 200 also includes the mode control circuit 204. The mode control circuit 204 generates a mode control signal MD for instructing the oversampling mode or the normal operation mode, and supplies the generated mode control signal MD to the CDR circuit 1. As a result, the CDR circuit 1 performs a sampling by shifting the multi-phase clocks by equivalent shift amounts, and adjusts the phase of the recovery clock CK while determining the advance or the delay. Thus, since the locking may be performed in a state where the phase of the recovery clock CK is appropriately adjusted, the recovery clock CK embedded in the data signal DE may be appropriately recovered.

Figure 2:
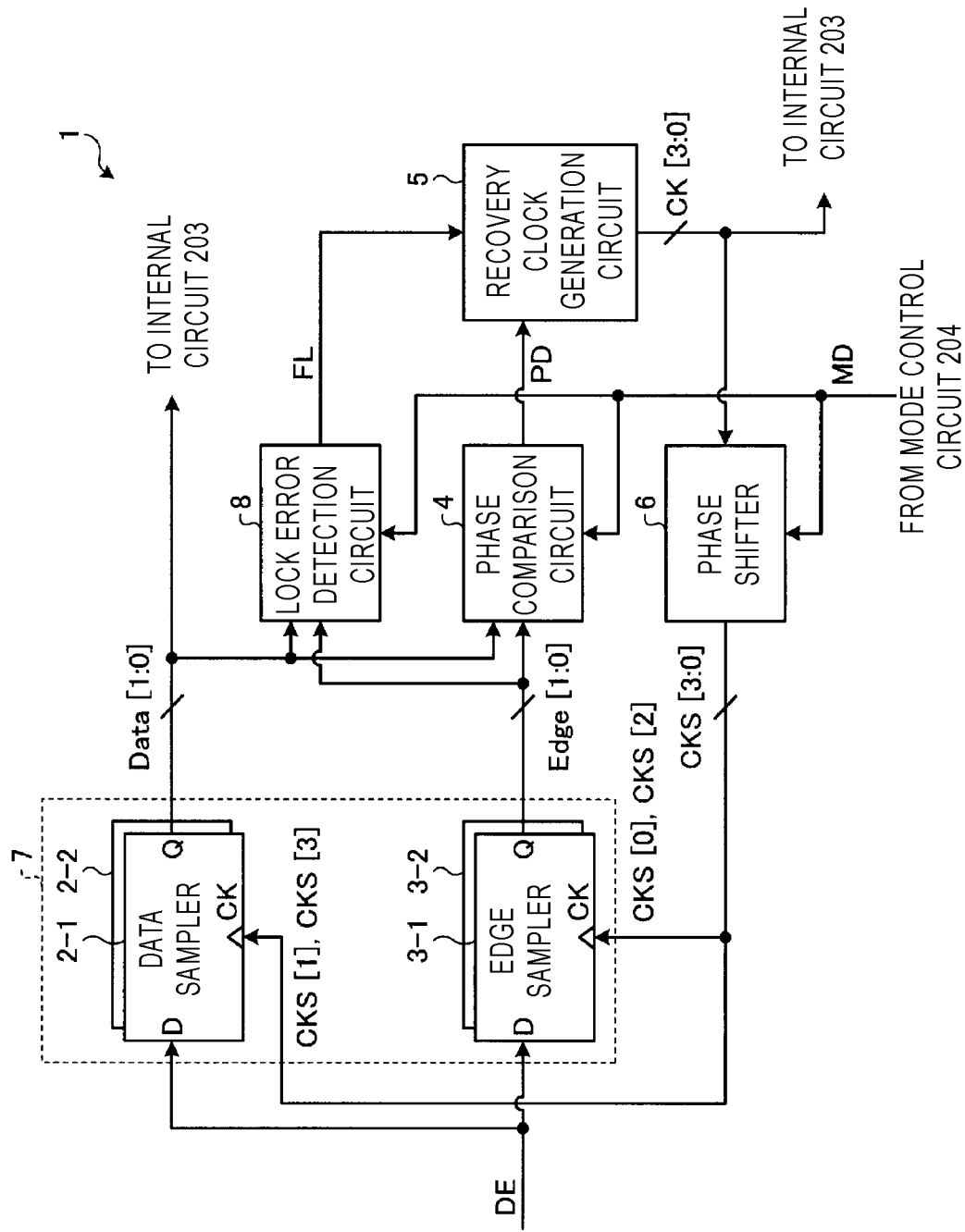
FIG. 2 is a diagram illustrating a circuit configuration of a CDR circuit according to an embodiment.

The CDR circuit 1 may be configured as illustrated in FIG. 2. FIG. 2 is a diagram illustrating a circuit configuration of the CDR circuit 1. The CDR circuit 1 includes a recovery clock generation circuit 5, a phase shifter circuit (hereinafter referred to as the "phase shifter 6"), a multi-phase sampling circuit 7, a phase comparison circuit 4, and a lock error detection circuit 8.

The recovery clock generation circuit 5 is disposed between the phase comparison circuit 4/the lock error detection circuit 8 and the internal circuit 203 (see FIG. 1). In the recovery clock generation circuit 5, an input node is electrically connected in parallel to the phase comparison circuit 4 and the lock error detection circuit 8, and an output node is electrically connected to the internal circuit 203.

The phase shifter 6 is disposed on a feedback path from the recovery clock generation circuit 5 to the multi-phase sampling circuit 7. In the phase shifter 6, an input node is electrically connected to the recovery clock generation circuit 5, an output node is electrically connected to the multi-phase sampling circuit 7, and a control node is electrically connected to the mode control circuit 204.

The multi-phase sampling circuit 7 includes a plurality of data samplers 2 and a plurality of edge samplers 3. In the case of FIG. 2, a data sampler 2-1 and an edge sampler 3-1 correspond to a data sampling timing and an edge sampling timing thereof. A data sampler 2-2 and an edge sampler 3-2 correspond to a data sampling timing and an edge sampling timing thereof.

The data sampler 2 and the edge sampler 3 are, for example, flip-flops, respectively, and are electrically connected to each other in parallel between the equalizer circuit 201 (see FIG. 1) and the phase comparison circuit 4. In the data sampler 2, a data input terminal D is electrically connected to the equalizer circuit 201, and a clock input terminal CK is electrically connected to the output side of the phase shifter 6. In the edge sampler 3, a data input terminal D is electrically connected to the equalizer circuit 201, and a clock input terminal CK is electrically connected to the output side of the phase shifter 6.

The phase comparison circuit 4 is disposed in parallel with the lock error detection circuit 8 between the multi-phase sampling circuit 7 and the recovery clock generation circuit 5. In the phase comparison circuit 4, an input node is electrically connected in parallel to the data sampler 2 and the edge sampler 3, an output node is electrically connected to the recovery clock generation circuit 5, and a control node is electrically connected to the mode control circuit 204. The phase comparison circuit 4 may be implemented by a binary output phase comparator with a simple configuration.

The lock error detection circuit 8 is disposed in parallel with the phase comparison circuit 4 between the multi-phase sampling circuit 7 and the recovery clock generation circuit 5. In the lock error detection circuit 8, an input node is electrically connected in parallel to the data sampler 2 and the edge sampler 3, an output node is electrically connected to the recovery clock generation circuit 5, and a control node is electrically connected to the mode control circuit 204.

The CDR circuit 1 switches the operation mode of the CDR circuit 1 between the oversampling mode and the normal mode according to a value of the mode control signal MD received from the mode control circuit 204.

Figure 3:
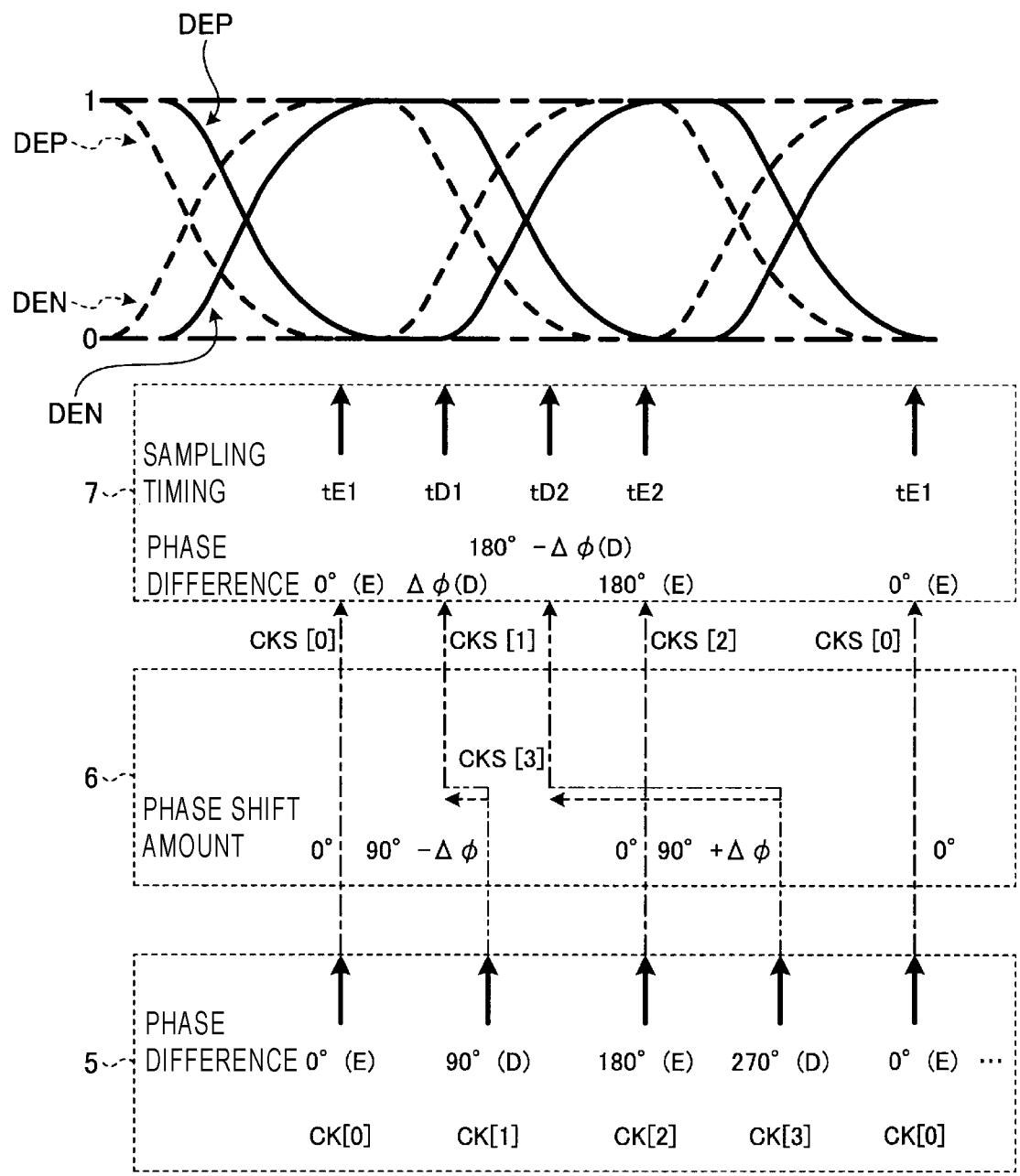
FIG. 3 is a diagram illustrating a phase shift operation in an oversampling mode in an embodiment.

For example, the mode control circuit 204 supplies the mode control signal MD with a value indicating the oversampling mode (e.g., MD=1) to the CDR circuit 1 in a time period in which the lock error may occur, for example, at the time of the startup of the receiving device 200. When the mode control signal MD=1, the CDR circuit 1 switches the operation mode of the CDR circuit 1 to the oversampling mode, and performs the operation illustrated in FIG. 3. FIG. 3 is a diagram illustrating a phase shift operation in the oversampling mode.

As illustrated in FIG. 3, the recovery clock generation circuit 5 generates a multi-phase clock CK[3:0] as a recovery clock CK. The multi-phase clock includes a plurality of clocks CK[0], CK[1], CK[2], and CK[3] having different phases. In the multi-phase clock, each of the clocks CK[0], CK[1], CK[2], and CK[3] has an equivalent phase difference from a clock having a closest phase (e.g., 90°). Among the clocks CK[0], CK[1], CK[2], and CK[3], CK[0] and CK[2] are for an edge sampling, and CK[1] and CK[3] are for a data sampling. The phase differences of the clocks CK[0], CK[1], CK[2], and CK[3] based on the phase of CK[0] and the indication of the edge sampling E or the data sampling D may be represented together as 0° (E), 90° (D), 180° (E), and 270° (D), respectively. That is, when the clocks are arranged in an ascending order of the phase difference, Equation 1 below is obtained.

(Phase difference of $CK$[0]: 0° ($E$))<(phase difference of $CK$[1]: 90° ($D$))<(phase difference of $CK$[2]: 180° ($E$))<(phase difference of $CK$[3]: 270° ($D$))      Equation 1

As represented in Equation 1, the edge timing of the clock CK for the edge sampling and the edge timing of the clock CK for the data sampling are alternately repeated in time. Further, FIG. 3 illustrates clocks CKS[0], CKS[1], CKS[2], and CKS[3] obtained by the phase shift operation on the clocks CK[0], CK[1], CK[2], and CK[3], respectively. Among the clocks CKS[0], CKS[1], CKS[2], and CKS[3], CKS[0] and CKS[2] are for the edge sampling, and CKS[1] and CKS[3] are for the data sampling.

In FIG. 2, the recovery clock generation circuit 5 supplies the multi-phase clock CK[3:0] to each of the internal circuit 203 (see FIG. 1) and the phase shifter 6.

The phase shifter 6 receives the multi-phase clock CK[3:0] from the recovery clock generation circuit 5, and receives the mode control signal MD (=1) from the mode control circuit 204. In response to the mode control signal MD=1, the phase shifter 6 shifts some clocks of the respective clocks in the multi-phase clock CK[3:0] by shift amounts which cause the shifted clocks to have different phases from the other clocks, so as to generate the clock CKS[3:0]. In this case, the phase shifter 6 positions the edge timings of the two clocks CKS[1] and CKS[3] to be supplied to the two data samplers 2-1 and 2-2, between the edge timings of the two clocks CKS[0] and CKS[2] to be supplied to the two edge samplers 3-1 and 3-2.

For example, in the case of FIG. 3, the phase shifter 6 shifts the clock CK[0] by a shift amount of 0° (that is, does not shift) to generate the clock CKS[0], and supplies the generated clock to the edge sampler 3-1. Assuming that Δφ is a predetermined phase angle larger than 0° and smaller than 90°, the phase shifter 6 shifts the clock CK[1] by a shift amount of 90°−Δφ to generate the clock CKS[1], and supplies the generated clock to the data sampler 2-1. The phase shifter 6 shifts the clock CK[2] by a shift amount of 0° (that is, does not shift) to generate the clock CKS[2], and supplies the generated clock to the edge sampler 3-2. The phase shifter 6 shifts the clock CK[3] by a shift amount of 90°+Δφ to generate the clock CKS[3], and supplies the generated clock to the data sampler 2-1.

The phase differences of the clocks CKS[0], CKS[1], CKS[2], and CKS[3] based on the phase of the CKS[0] and the indication of the edge sampling E or the data sampling D may be represented together as 0° (E), Δφ (D), 180° (E), and 180°−Δφ (D), respectively. That is, when the clocks are arranged in an ascending order of the phase difference, Equation 2 below is obtained.

(Phase difference of $CKS$[0]: 0° ($E$))<(phase difference of $CKS$[1]: Δφ($D$))<(phase difference of $CKS$[3]: 180°−Δφ($D$))<(phase difference of $CKS$[2]: 180° ($E$))      Equation 2

As represented in Equation 2, the edge timings of the plurality of clocks CKS[1] and CKS[3] for the data sampling may be positioned between the edge timings of the plurality of clocks CKS[0] and CKS[2] for the edge sampling. Therefore, the clock CKS[3:0] may be generated, which is suitable for intentionally oversampling the data portion in the data signal DE. The data signal DE is, for example, a differential signal and includes a P-side signal DEP and an N-side signal DEN.

In FIG. 2, the phase shifter 6 supplies the generated clock CKS[3:0] to the multi-phase sampling circuit 7.

In the multi-phase sampling circuit 7, the edge sampler 3-1 receives the data signal DE from the equalizer circuit 201, and receives the clock CKS[0] from the phase shifter 6. The edge sampler 3-1 samples the edge portion in the data signal DE (i.e., the signals DEP and DEN) at a timing tE1 synchronized with a rising edge of the clock CKS[0] (edge sampling timing tE[0°] corresponding to the phase difference 0°). The edge sampler 3-1 supplies a sampling result Edge[0] to the phase comparison circuit 4 and the lock error detection circuit 8.

The data sampler 2-1 receives the data signal DE from the equalizer circuit 201, and receives the CKS[1] for the data sampling D from the phase shifter 6. The data sampler 2-1 samples the data portion in the data signal DE (i.e., the signals DEP and DEN) at a timing tD1 synchronized with the rising edge of the clock CKS[1] (data sampling timing tD[Δφ] corresponding to the phase difference of Δφ). The data sampler 2-1 supplies a sampling result Data[0] to the phase comparison circuit 4 and the lock error detection circuit 8.

The data sampler 2-2 receives the data signal DE from the equalizer circuit 201, and receives the CKS[3] for the data sampling D from the phase shifter 6. The data sampler 2-2 samples the data portion in the data signal DE (i.e., the signals DEP and DEN) at a timing tD2 synchronized with the rising edge of the CKS[3] for the data sampling D (data sampling timing tD[180°−Δφ] corresponding to the phase difference of 180°−Δφ). The data sampler 2-2 supplies a sampling result Data[1] to the phase comparison circuit 4 and the lock error detection circuit 8.

The edge sampler 3-2 receives the data signal DE from the equalizer circuit 201, and receives the clock CKS[2] from the phase shifter 6. The edge sampler 3-2 samples the edge portion in the data signal DE (i.e., the signals DEP and DEN) at a timing tE2 synchronized with the rising edge of the clock CKS[2] (edge sampling timing tE[180°] corresponding to the phase difference of 180°). The edge sampler 3-2 supplies the sampling result Edge[1] to the phase comparison circuit 4 and the lock error detection circuit 8.

The phase comparison circuit 4 receives the sampling result Edge[0] of the edge sampling timing tE[0°] from the edge sampler 3-1. The phase comparison circuit 4 receives the sampling result Data [0] of the data sampling timing tD [Δφ] from the data sampler 2-1. The phase comparison circuit 4 receives the sampling result Data[1] of the data sampling timing tD[180°−Δφ] from the data sampler 2-2. The phase comparison circuit 4 receives the sampling result Edge[1] of the edge sampling timing tE[180°] from the edge sampler 3-2. The phase comparison circuit 4 receives the mode control signal MD from the mode control circuit 204. The phase comparison circuit 4 performs a phase comparison operation on the time series patterns of the plurality of received sampling results in response to the mode control signal MD=1. That is, the phase comparison circuit 4 determines whether the edge portions of the clock CKS[0] and [2] are advanced ("Early") or delayed ("Late") with respect to the edge portion of the data signal DE, and supplies a determination result PD to the recovery clock generation circuit 5.

Here, the determination operation and the lock error detection operation in the oversampling mode will be described with reference to FIG. 4. FIG. 4 is a table for explaining the determination operation and the lock error detection operation in the oversampling mode. For example, the phase comparison circuit 4 determines that the edge portion of the clock CKS[0] is advanced ("Early") with respect to the edge portion of the data signal DE, according to a sampling result (Edge[0], Data[0], Data[1], Edge[1])= (0, 1, 1, 1) illustrated in FIG. 4. According to the determination result of the advance, the phase comparison circuit 4 generates a determination result PD='Early', and supplies the generated determination result to the recovery clock generation circuit 5. Further, in the sampling results illustrated in FIG. 4, "0" or "1 is a value corresponding to either DEN or DEP.

In addition, the phase comparison circuit 4 determines that the edge portion of the clock CKS[0] is delayed ("Late") with respect to the edge portion of the data signal DE, according to the sampling result (Edge[0], Data[0], Data[1], Edge[1])=(1, 1, 1, 0). According to the determination result of the delay, the phase comparison circuit 4 generates a determination result PD='Late', and supplies the generated determination result to the recovery clock generation circuit 5.

In addition, the phase comparison circuit 4 determines that the edge portion of the clock CKS[0] is delayed ("Late") with respect to the edge portion of the data signal DE, according to a sampling result (Edge[0], Data[0], Data[1], Edge[1])=(0, 0, 0, 1). According to the determination result of the delay, the phase comparison circuit 4 generates a determination result PD='Late', and supplies the generated determination result to the recovery clock generation circuit 5.

In addition, the phase comparison circuit 4 determines that the edge portion of the clock CKS[0] is advanced ("Early") with respect to the edge portion of the data signal DE, according to a sampling result (Edge[0], Data[0], Data [1], Edge[1])=(1, 0, 0, 0). According to the determination result of the advance, the phase comparison circuit 4 generates a determination result PD='Early', and supplies the generated determination result to the recovery clock generation circuit 5.

The lock error detection circuit 8 illustrated in FIG. 2 receives the sampling result Edge[0] of the edge sampling timing tE[0°] from the edge sampler 3-1. The lock error detection circuit 8 receives the sampling result Data[0] of the data sampling timing tD [Δφ] from the data sampler 2-1. The lock error detection circuit 8 receives the sampling result Data[1] of the data sampling timing tD [180°−Δφ] from the data sampler 2-2. The lock error detection circuit 8 receives the sampling result Edge[1] of the edge sampling timing tE[180°] from the edge sampler 3-2. The lock error detection circuit 8 receives the mode control signal MD from the mode control circuit 204. The lock error detection circuit 8 performs the lock error detection operation on the time series patterns of the sampling results in response to the mode control signal MD=1. That is, the lock error detection circuit 8 detects whether the edge portion of the clock CKS[0] is in a phase relationship in which the lock error is more likely to occur ("lock error") or a phase relationship in which the lock error is difficult to occur ("appropriately lockable"), with respect to the edge portion of the data signal DE, and supplies a detection result FL to the recovery clock generation circuit 5.

For example, the lock error detection circuit 8 detects that the edge portion of the clock CKS[0] is in the phase relationship in which the lock error is more likely to occur ("lock error") with respect to the edge portion of the data signal DE, according to the sampling result (Edge[0], Data [0], Data[1], Edge[1])=(1, 1, 0, 0) illustrated in FIG. 4. According to the detection result of "lock error," the lock error detection circuit 8 generates a detection result FL='lock error' and supplies the generated detection result to the recovery clock generation circuit 5.

In addition, the lock error detection circuit 8 detects that the edge portion of the clock CKS[0] is in the phase relationship in which the lock error is more likely to occur ("lock error") with respect to the edge portion of the data signal DE, according to the sampling result (Edge[0], Data Data[1], Edge[1])=(0, 0, 1, 1). According to the detection result of "lock error," the lock error detection circuit 8 generates a detection result FL='lock error' and supplies the generated detection result to the recovery clock generation circuit 5.

In addition, the lock error detection circuit 8 detects that the edge portion of the clock CKS[0] is in the phase relationship in which the lock error is difficult to occur ("appropriately lockable") with respect to the edge portion of the data signal DE, according to a sampling result (Edge[0], Data[0], Data[1], Edge[1]) having other values than those in FIG. 4 (not illustrated). According to the detection result of "appropriately lockable," the lock error detection circuit 8 generates a detection result FL='appropriately lockable' and supplies the generated detection result to the recovery clock generation circuit 5.

The recovery clock generation circuit 5 of FIG. 2 receives the determination result PD from the phase comparison circuit 4, and receives the detection result FL from the lock error detection circuit 8. The recovery clock generation circuit 5 generates the multi-phase clock CK[3:0] according to the determination result PD and the detection result FL. The recovery clock generation circuit 5 includes an original oscillation circuit that generates a reference clock and an oscillation circuit such as a PLL that oscillates using the reference clock. The recovery clock generation circuit 5 adjusts a phase control amount (a control amount for advancing or delaying the phase of each clock CK[3:0] generated by the oscillation circuit with respect to the reference clock) for the oscillation circuit according to the determination result PD and the detection result FL, to generate the multi-phase clock CK[3:0] of which the clocks are adjusted to a predetermined phase relationship. The recovery clock generation circuit 5 outputs the generated multi-phase clock CK[3:0] and supplies the output multi-phase clock CK[3:0] to the internal circuit 203 and the phase shifter 6.

For example, when an equalization by a front end circuit 202 is an over equalization, an eye pattern waveform of the data signal DE may be split into a waveform of a broken line and a waveform of a solid line as illustrated in an upper diagram of FIG. 3. The upper diagram of FIG. 3 represents the eye pattern waveform of the data signal DE, and the horizontal axis and the vertical axis indicate time and an amplitude level, respectively. In the upper diagram of FIG. 3, an amplitude level corresponding to a level L is represented as a logic value "0," and an amplitude level corresponding to a level H is represented as a logic value "1."

For example, when the detection result FL is 'appropriately lockable' and the determination result PD is 'Early', the recovery clock generation circuit 5 illustrated in FIG. 2 adjusts the phase control amount for the oscillation circuit so as to delay the clock CKS[0] from the present time. Thus, the recovery clock generation circuit 5 outputs the multi-phase clock CK[3:0] of which phase relationship is delayed with respect to the reference clock.

In addition, when the detection result FL is 'appropriately lockable' and the determination result PD is 'Late', the recovery clock generation circuit 5 adjusts the phase control amount for the oscillation circuit so as to advance the clock CKS[0] from the present time. Thus, the recovery clock generation circuit 5 outputs the multi-phase clock CK[3:0] of which the phase relationship is advanced with respect to the reference clock.

Meanwhile, each of the solid line and the broken line in the upper diagram of FIG. 3 represents a state where FL is 'lock error' as an example. When the detection result FL is 'lock error', the recovery clock generation circuit 5 largely changes the phase control amount for the oscillation circuit from a current phase control amount or resets the oscillation circuit and returns the oscillation circuit to an initial state, in order to escape the state in which the lock error is more likely to occur. Thus, the recovery clock generation circuit 5 outputs the multi-phase clock CK[3:0] of which the phase relationship is largely changed with respect to the reference clock, and supplies the output multi-phase clock CK[3:0] to the internal circuit 203 and the phase shifter 6. That is, since the data signal DE is intentionally oversampled while using the same recovery clock generation circuit 5 as that in the normal mode (i.e., while utilizing an existing circuit resource), the lock error may be avoided while preventing an increase in cost and power consumption.

Figure 5:
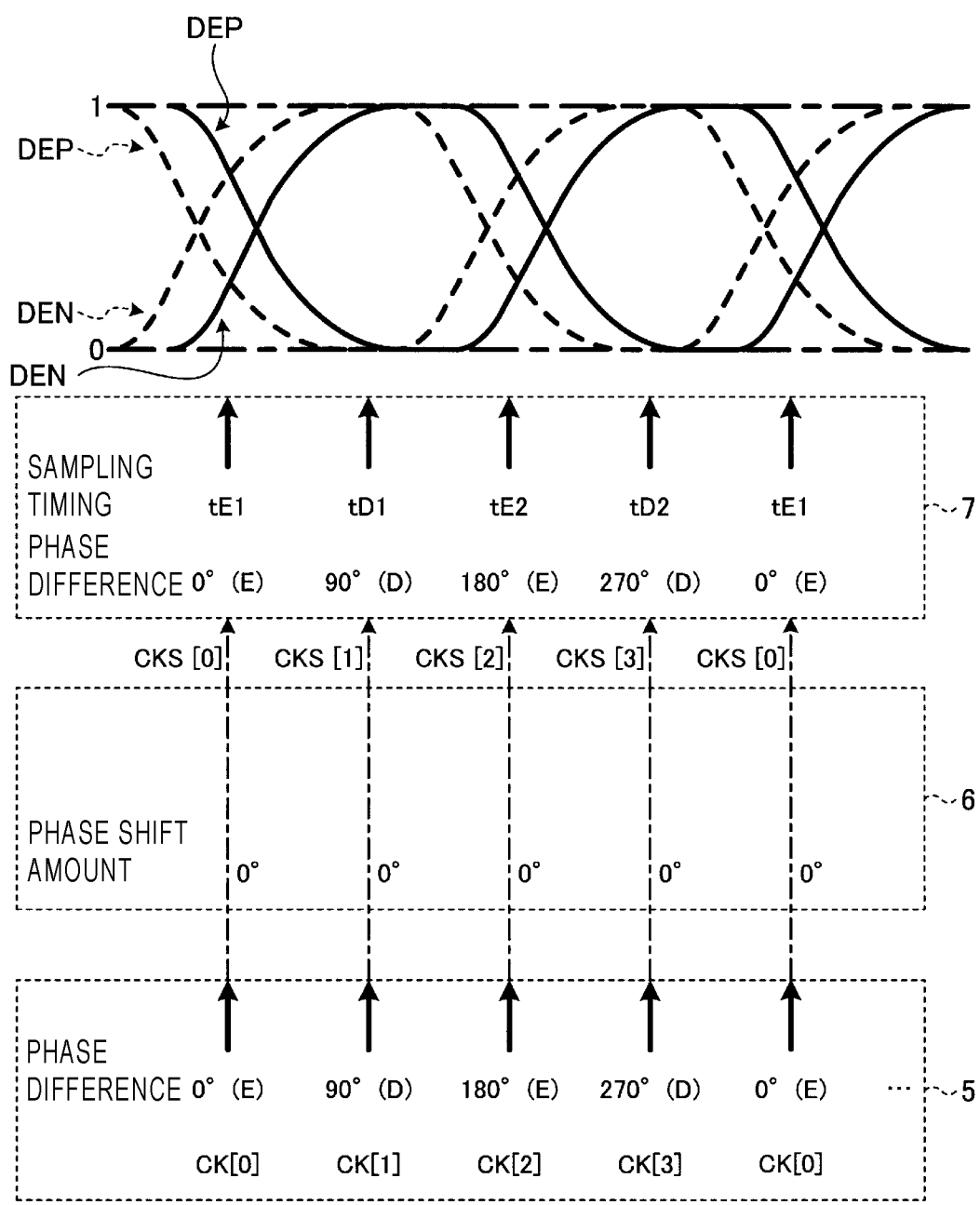
FIG. 5 is a diagram illustrating a phase shift operation in a normal mode in an embodiment.

For example, when the operation mode of the CDR circuit 1 is the oversampling mode, the mode control circuit 204 supplies the mode control signal MD with a value indicating the normal mode (e.g., MD=0) to the CDR circuit 1, according to a state in which the lock error detection circuit 8 is appropriately lockable such as a state where the lock error detection circuit continuously outputs the detection result FL as 'appropriately lockable'. When the mode control signal MD is 0, the CDR circuit 1 switches the operation mode of the CDR circuit 1 to the normal mode and performs the operation illustrated in FIG. 5. FIG. 5 is a diagram illustrating the phase shift operation in the normal mode.

As illustrated in FIG. 5, the phase shifter 6 receives the multi-phase clock CK[3:0] from the recovery clock generation circuit 5, receives the mode control signal MD (=0) from the mode control circuit 204, and operates in the normal mode. That is, in response to the mode control signal MD as 0, the phase shifter 6 generates a sampling clock CKS[3:0] obtained by shifting the multi-phase clock CK[3:0] by an equivalent shift amount.

For example, in the case of FIG. 5, the phase shifter 6 shifts the clock CK[0] by a shift amount of 0° (that is, does not shift) to generate a clock CKS[0], and supplies the generated clock to the edge sampler 3-1. The phase shifter 6 shifts the clock CK[1] by a shift amount of 0° (that is, does not shift) to generate a clock CKS[1], and supplies the generated clock to the data sampler 2-1. The phase shifter 6 shifts the clock CK[2] by a shift amount of 0° (that is, does not shift) to generate a clock CKS[2], and supplies the generated clock to the edge sampler 3-2. The phase shifter 6 shifts the clock CK[3] by a shift amount of 0° (that is, does not shift) to generate a clock CKS[3], and supplies the generated clock to the data sampler 2-2.

The phase differences of the clocks CKS[0], CKS[1], CK[2], and CKS[3] based on the phase of CKS[0] and the indication of the edge sampling E or the data sampling D may be represented together as 0° (E), 90° (D), 180° (E), 270° (D), respectively. That is, when the clocks are arranged in an ascending order of the phase difference, Equation 3 below is obtained.

(Phase difference of $CKS[0]$: 0° $(E)$)<(phase difference of $CKS[1]$: 90° $(D)$)<(phase difference of $CKS[2]$: 180° $(E)$)<(phase difference of $CKS[3]$: 270° $(D)$))   Equation 3

As represented in Equation 3, the edge timing of the clock CKS for the edge sampling and the edge timing of the clock CKS for the data sampling are alternately repeated in time.

In FIG. 2, the phase shifter 6 supplies the generated clock CKS[3:0] to the multi-phase sampling circuit 7.

In the multi-phase sampling circuit 7, the edge sampler 3-1 samples the edge portion in the data signal DE (i.e., the signals DEP and DEN) at a timing tE1 synchronized with the rising edge of the clock CKS[0] (edge sampling timing tE[0°] corresponding to the phase difference of 0°). The edge sampler 3-1 supplies a sampling result Edge[0] to the phase comparison circuit 4 and the lock error detection circuit 8.

The data sampler 2-1 samples the data portion in the data signal DE (i.e., the signals DEP and DEN) at a timing tD1 synchronized with the rising edge of the clock CKS[1] (data sampling timing tD[90°] corresponding to the phase difference of 90°). The data sampler 2-1 supplies a sampling result Data[0] to the phase comparison circuit 4 and the lock error detection circuit 8.

The edge sampler 3-2 samples the edge portion in the data signal DE (i.e., the signals DEP and DEN) at a timing tE2 synchronized with the rising edge of the clock CKS[2] (edge sampling timing tE[180°] corresponding to the phase difference of 180°). The edge sampler 3-1 supplies a sampling result Edge[1] to the phase comparison circuit 4 and the lock error detection circuit 8.

The data sampler 2-2 samples the data portion in the data signal DE (i.e., the signals DEP and DEN) at a timing tD2 synchronized with the rising edge of the CKS[3] for the data sampling D (data sampling timing tD[270°] corresponding to the phase difference of 270°). The data sampler 2-2 supplies a sampling result Data[1] to the phase comparison circuit 4 and the lock error detection circuit 8.

The phase comparison circuit 4 receives the sampling result Edge [0] of the edge sampling timing tE [0°] from the edge sampler 3-1. The phase comparison circuit 4 receives the sampling result Data[0] of the data sampling timing tD[90°] from the data sampler 2-1. The phase comparison circuit 4 receives the sampling result Edge[1] of the edge sampling timing tE[180°] from the edge sampler 3-2. The phase comparison circuit 4 receives the sampling result Data[1] of the data sampling timing tD[270°] from the data sampler 2-2. The phase comparison circuit 4 receives the mode control signal MD from the mode control circuit 204. The phase comparison circuit 4 performs a phase comparison operation on the time series patterns of the plurality of received sampling results in response to the mode control signal MD being 0.

Here, the determination operation in the normal mode will be described with reference to FIG. 6. FIG. 6 is a table for explaining the determination operation in the normal mode. For example, the phase comparison circuit 4 determines that the edge portion of the clock CKS[0] is advanced ("Early") with respect to the edge portion of the data signal DE, according to a sampling result (Edge[0], Data[0], Edge[1])=(0, 1, 1) illustrated in FIG. 6. According to the determination result of the advance, the phase comparison circuit 4 generates a determination result PD as being 'Early' and supplies the generated determination result to the recovery clock generation circuit 5.

In addition, the phase comparison circuit 4 determines that the edge portion of the clock CKS[0] is delayed ("Late") with respect to the edge portion of the data signal DE, according to a sampling result (Edge[0], Data Edge[1])=(1, 1, 0). According to the determination result of the delay, the phase comparison circuit 4 generates a determination result PD as being 'Late' and supplies the generated determination result to the recovery clock generation circuit 5.

In addition, the phase comparison circuit 4 determines that the edge portion of the clock CKS[0] is delayed ("Late") with respect to the edge portion of the data signal DE, according to a sampling result (Edge[0], Data[0], Edge[1])=(0, 0, 1). According to the determination result of the delay, the phase comparison circuit 4 generates a determination result PD as being 'Late' and supplies the generated determination result to the recovery clock generation circuit 5.

In addition, the phase comparison circuit 4 determines that the edge portion of the clock CKS[0] is advanced ("Early") with respect to the edge portion of the data signal DE, according to a sampling result (Edge[0], Data[0], Edge[1])=(1, 0, 0). According to the determination result of the advance, the phase comparison circuit 4 generates a determination result PD as being 'Early' and supplies the generated determination result to the recovery clock generation circuit 5.

Further, when the lock error detection circuit 8 illustrated in FIG. 2 receives the mode control signal MD as being 0, the lock error detection circuit 8 stops the operation. Thus, in the normal mode, the lock error detection circuit 8 does not supply the detection result FL to the recovery generation circuit 5. Alternatively, in the normal mode, the lock error detection circuit 8 may supply a detection result FL indicating that no lock error occurs, to the recovery generation circuit 5. Further, a definition of the value of MD may be reversed, such that the mode control signal MD as being 0 may indicate the oversampling mode and the mode control signal MD=1 may indicate the normal mode.

The recovery clock generation circuit 5 illustrated in FIG. 2 receives the determination result PD from the phase comparison circuit 4. The recovery clock generation circuit 5 generates the multiphase clock CK[3:0] adjusted to a predetermined phase relationship by adjusting the phase control amount for the oscillation circuit according to the determination result PD. The recovery clock generation circuit 5 supplies the multi-phase clock CK[3:0] to the internal circuit 203 and the phase shifter 6. That is, in the normal mode, since the locking may be performed in a state where the phase of the recovery clock CK is appropriately adjusted, the recovery clock CK embedded in the data signal DE may be appropriately recovered.

As described above, in the embodiment, the CDR circuit 1 intentionally oversamples the data signal DE by shifting some clocks among the multi-phase clocks by shift amounts different from the other clocks in the oversampling mode. Thus, the lock error may be avoided while reducing the costs and the power consumption, thereby appropriately recovering the recovery clock CK.

Further, the phase difference between the CKS[1] and the CKS[0] for the data sampling D in the oversampling mode may be different from the phase difference between the CKS[3] and the CKS[2]. For example, when $\Delta\varphi1$ and $\Delta\varphi2$ are set to predetermined phase angles which are different from each other and are larger than 0° and smaller than 90°, phase differences of the clocks CKS[0], CKS[1], CKS[2], and CKS[3] based on the phase of the CKS[0] may be 0° (E), $\Delta\varphi1$ (D), 180° (E), and 180°−$\Delta\varphi$ (D), respectively.

In addition, the phase adjustment in the normal mode may be performed multiple times during one period. For example, in addition to the phase comparison operation illustrated in FIG. 6, the phase comparison circuit 4 may perform a phase comparison operation by replacing Edge[0], Data[0], and Edge[1] in FIG. 6 with Edge[1], Data[1], and Edge[0].

For example, the phase comparison circuit 4 determines that the edge portion of the clock CKS[0] is advanced ("Early") with respect to the edge portion of the data signal DE, according to a sampling result (Edge[1], Data[1], Edge[0])=(0, 1, 1). According to the determination result of the advance, the phase comparison circuit 4 generates a determination result PD as being 'Early' and supplies the generated determination result to the recovery clock generation circuit 5.

In addition, the phase comparison circuit 4 determines that the edge portion of the clock CKS[0] is delayed ("Late") with respect to the edge portion of the data signal DE, according to a sampling result (Edge[1], Data[1], Edge[0])=(1, 1, 0). According to the determination result of the delay, the phase comparison circuit 4 generates a determination result PD as being 'Late' and supplies the generated determination result to the recovery clock generation circuit 5.

In addition, the phase comparison circuit 4 determines that the edge portion of the clock CKS[0] is delayed ("Late") with respect to the edge portion of the data signal DE, according to a sampling result (Edge[1], Data[1], Edge[0])=(0, 0, 1). According to the determination result of the delay, the phase comparison circuit 4 generates a determination result PD as being 'Late' and supplies the generated determination result to the recovery clock generation circuit 5.

In addition, the phase comparison circuit 4 determines that the edge portion of the clock CKS[0] is advanced ("Early") with respect to the edge portion of the data signal DE, according to a sampling result (Edge[1], Data[1], Edge[0])=(1, 0, 0). According to the determination result of the advance, the phase comparison circuit 4 generates a determination result PD as being 'Early' and supplies the generated determination result to the recovery clock generation circuit 5.

As described above, the phase adjustment in the normal mode is performed multiple times during one period, so that a time until the phase becomes a lock state may be reduced, and the accuracy of the phase adjustment may be improved.

Figure 7:
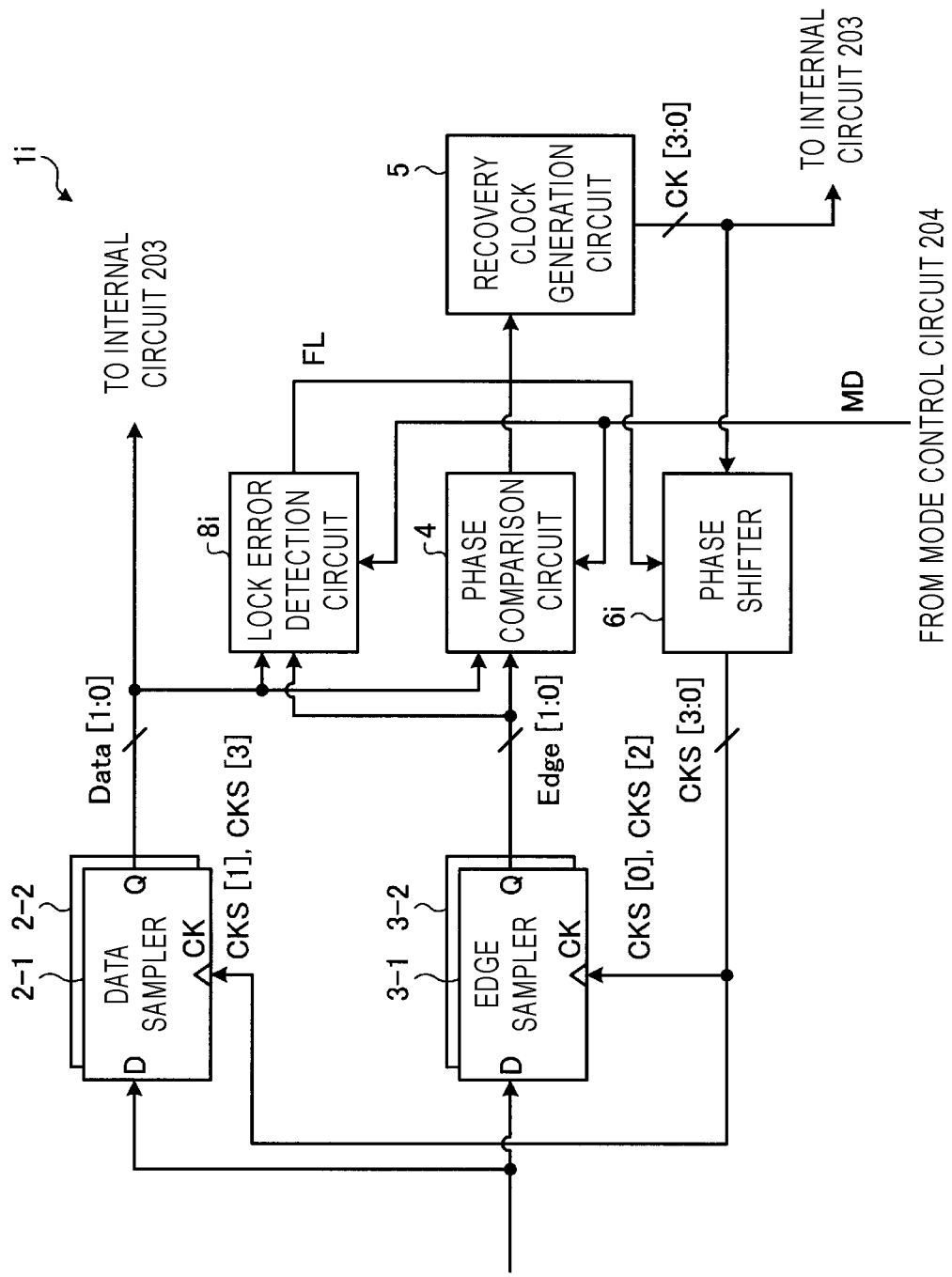
FIG. 7 is a diagram illustrating a circuit configuration of a CDR circuit according to a first modification of the embodiment.

In addition, as illustrated in FIG. 7, in a CDR circuit 1i, a lock error detection circuit 8i may supply the detection result FL to a phase shifter 6i, instead of the recovery clock generation circuit 5. FIG. 7 is a diagram illustrating a circuit configuration of the CDR circuit 1*i* according to a first modification of the embodiment. In this case, the phase shifter 6*i* may not receive the mode control signal MD from the mode control circuit 204. For example, in the oversampling mode, the lock error detection circuit 8*i* generates the detection result FL as being "appropriately lockable" or the detection result FL as being "lock error," and supplies the detection result to the phase shifter 6*i*. While the detection result FL as being "appropriately lockable" is being received, the phase shifter 6*i* shifts some clocks of the respective clocks in the multi-phase clock CK[3:0] by shift amounts different from the other clocks to generate the CKS[3:0]. When the detection result FL as being 'lock error' is being received, the phase shifter 6*i* changes or resets the shift amount of each clock from the current shift amount (e.g., returns the shift amount to the shift amount of 0°). The phase shift 6*i* shifts each clock in the multi-phase clock CK[3:0] by the changed shift amount to generate the clock CKS[3:0]. By this operation as well, it is possible to escape the state in which the lock error is more likely to occur.

Figure 8:
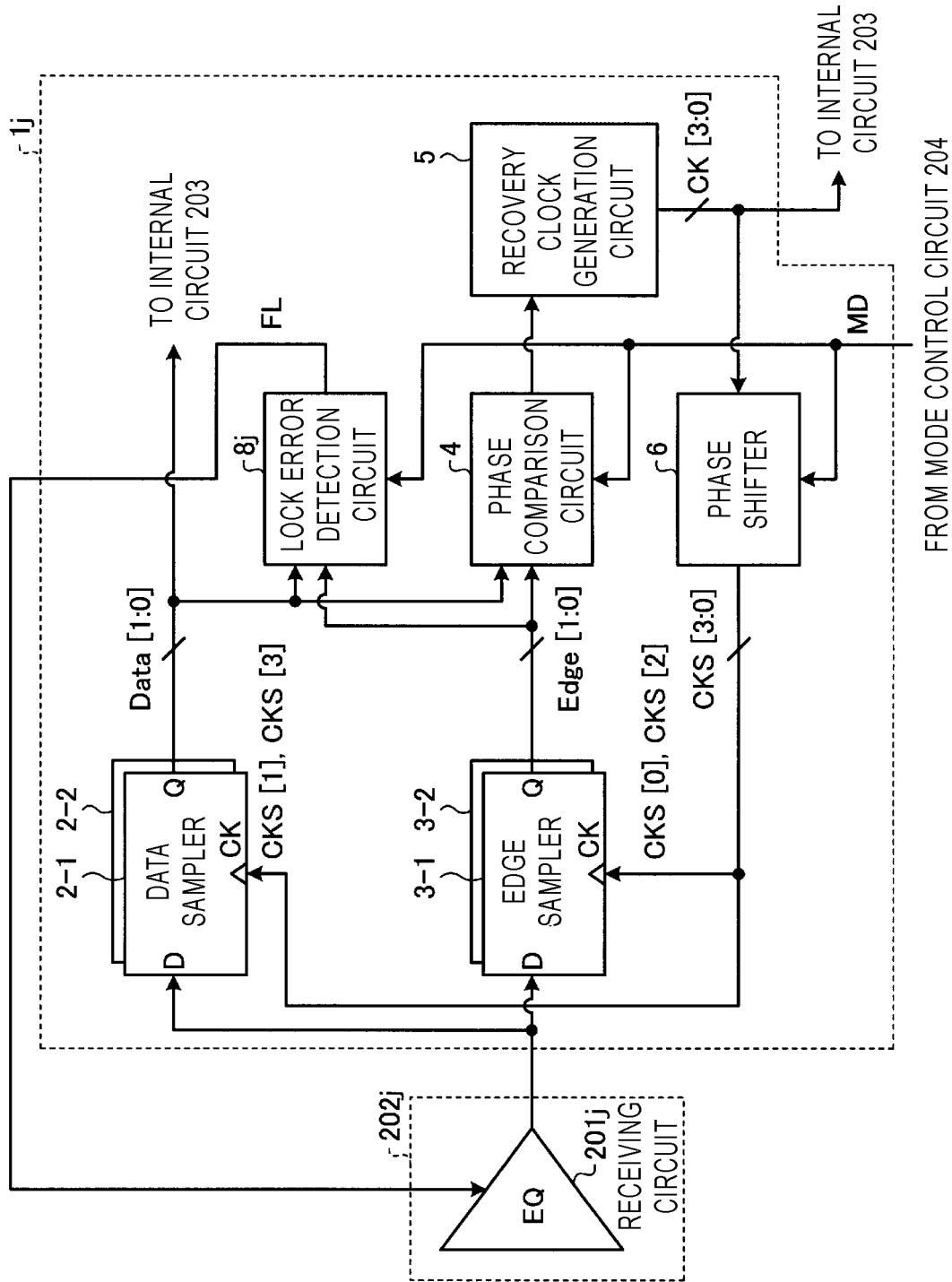
FIG. 8 is a diagram illustrating circuit configurations of a receiving circuit and a CDR circuit according to a second modification of the embodiment.

In addition, as illustrated in FIG. 8, in a CDR circuit 1*j*, a lock error detection circuit 8*j* may supply the detection result FL to an equalizer circuit 201*j* of a receiving circuit 202*j*, instead of the recovery clock generation circuit 5. FIG. 8 is a diagram illustrating circuit configurations of the receiving circuit 202*j* and the CDR circuit 1*j* according to a second modification of the embodiment. For example, in the oversampling mode, the lock error detection circuit 8*j* generates the detection result FL as being "appropriately lockable" or the detection result FL as being "lock error," and supplies the detection result to an equalizer circuit 201*j*. While the detection result FL as being "appropriately lockable" is being received, the equalizer circuit 201*j* equalizes a modulation signal from a transmission signal with a current compensation amount. When the detection result FL as being 'lock error' is received, the equalizer circuit 201*j* changes or resets the compensation amount from the current compensation amount (e.g., returns the compensation amount to a reference compensation amount). The equalizer circuit 201*j* equalizes the modulation signal from the transmission signal with the changed compensation amount. The equalizer circuit 201*j* supplies the compensated signal as the data signal DE to the CDR circuit 1*j*. By this operation as well, it is possible to escape the state in which the lock error is more likely to occur.

Figure 9:
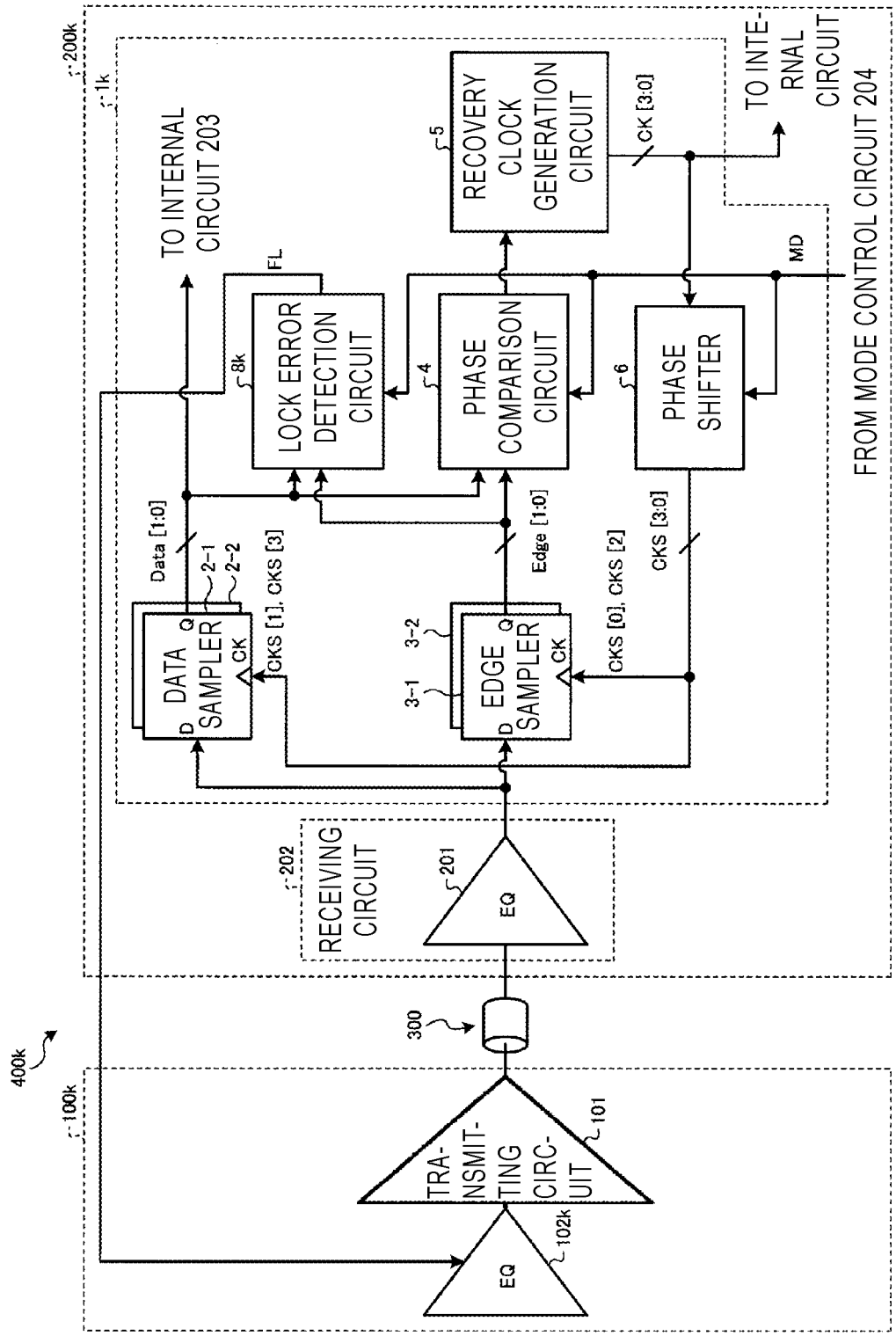
FIG. 9 is a diagram illustrating a communication system including a CDR circuit according to a third modification of the embodiment.

In addition, as illustrated in FIG. 9, in a CDR circuit 1*k*, a lock error detection circuit 8*k* may supply the detection result FL to an equalizer circuit 102*k* of a transmitting device 100*k*, instead of the recovery clock generation circuit 5. FIG. 9 is a diagram illustrating a communication system 400*k* including a CDR circuit 1*k* according to a third modification of the embodiment. For example, in the oversampling mode, the lock error detection circuit 8*k* generates the detection result FL as being "appropriately lockable" or the detection result FL as being "lock error," and supplies the detection result to the equalizer circuit 102*k*. While the detection result FL as being "appropriately lockable" is being received, the equalizer circuit 102*k* generates a transmission signal by equalizing a modulation signal with a current compensation amount, and supplies the generated transmission signal to the transmitting circuit 101. When the detection result FL as being 'lock error' is received, the equalizer circuit 102*k* changes or resets the compensation amount from the current compensation amount (e.g., returns the compensation amount to the reference compensation amount). The equalizer circuit 102*k* generates a transmission signal by performing an equalization on a modulation signal with a particular compensation amount and supplies the generated transmission signal to the transmitting circuit 101. The transmitting circuit 101 transmits the transmission signal to a receiving device 200*k* via the transmission path 300. By this operation as well, the CDR circuit 1*k* in the receiving device 200*k* may escape the state in which the lock error is more likely to occur.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A clock recovery circuit comprising:
   a multi-phase sampling circuit including a plurality of edge samplers and a plurality of data samplers, a data signal being input to each of the plurality of edge samplers and each of the plurality of data samplers;
   a phase comparison circuit disposed at an output side of the multi-phase sampling circuit;
   a recovery clock generation circuit disposed at an output side of the phase comparison circuit and configured to output multi-phase clock signals; and
   a phase shifter circuit disposed between the recovery clock generation circuit and the multi-phase sampling circuit and configured to generate a plurality of clock signals to be supplied to the multi-phase sampling circuit by shifting a phase of a first one of the multi-phase clock signals output from the recovery clock generation circuit by a shift amount different from a shift amount of a second one of the multi-phase clock signals.

2. The clock recovery circuit according to claim 1, further comprising:
   a lock error detection circuit disposed at the output side of the multi-phase sampling circuit in parallel with the phase comparison circuit.

3. The clock recovery circuit according to claim 2, wherein an output of the lock error detection circuit is electrically connected to the recovery clock generation circuit.

4. The clock recovery circuit according to claim 2, wherein the output of the lock error detection circuit is electrically connected to the phase shifter circuit.

5. The clock recovery circuit according to claim 1, wherein the multi-phase sampling circuit includes:
   a first edge sampler;
   a first data sampler;
   a second edge sampler; and
   a second data sampler, wherein
   the clock signals supplied to the multi-phase sampling circuit include a first clock signal supplied to the first edge sampler, a second clock signal supplied to the second edge sampler, a third clock signal supplied to the first data sampler, and a fourth clock signal supplied to the second data sampler, and
   edge timings of the third and fourth clock signals in a cycle are between an edge timing of the first clock signal in the cycle and an edge timing of the second clock signal in the cycle.

6. A receiving device comprising:
a front end circuit capable of receiving data through a transmission path; and
the clock recovery circuit according to claim 1, the clock recovery circuit being configured to receive the data from the front end circuit.

7. A clock recovery circuit comprising:
a first circuit including a plurality of circuits configured to sample data based on a clock signal;
a second circuit configured to output a determination result based on outputs from the plurality of circuits of the first circuit;
a third circuit configured to output a plurality of first clock signals including a first clock signal and a second clock signal that have different phases from each other based on the determination result output from the second circuit; and
a fourth circuit configured to receive the plurality of first clock signals output from the third circuit and supply to the first circuit a plurality of second clock signals including a third clock signal having the same phase as the first clock signal, a fourth clock signal having the same phase as the second clock signal, and a fifth clock signal having a different phase from each of the first and second clock signals and having an edge between an edge of the third clock signal and an edge of the fourth clock signal.

8. A receiving device comprising:
a circuit capable of receiving data through a transmission path; and
a clock recovery circuit configured to receive the data from the circuit, the clock recovery circuit comprising:
a clock generation circuit configured to generate multi-phase clock signals including first, second, third, and fourth clock signals that have phases advanced in this order;
a phase shifter circuit configured to perform phase-shift with respect to at least part of the first, second, third, and fourth clock signals, such that a phase of the fourth clock signal is between a phase of the first clock signal and a phase of the third clock signal;
first, second, third, and fourth samplers configured to sample a data signal in accordance with the first, second, third, and fourth clock signals, respectively; and
a detection circuit configured to receive sampling results of the first, second, third, and fourth samplers, and generate a control signal that causes the first, second, third, and fourth clock signals and the data signal to be in synchronization with each other when the received sampling results indicate that the first, second, third, and fourth clock signals and the data signal are not in synchronization with each other.

9. The receiving device according to claim 8, further comprising:
a mode control circuit configured to cause the phase shifter circuit to perform the phase shift during a first operational mode, and not to perform the phase shift during a second operational mode.

10. The receiving device according to claim 9, wherein the mode control circuit is configured to supply, to the phase shifter circuit, a mode control signal that causes the phase shifter circuit to perform the phase shift during the first operational mode, and not supply the mode control signal to the phase shifter circuit during the second operational mode.

11. The receiving device according to claim 9, wherein the mode control circuit is configured to supply, to the detection circuit, a mode control signal that enables the detection circuit during the first operational mode, and not supply the mode control signal during the second operational mode.

12. The receiving device according to claim 8, wherein the detection circuit is configured to supply the control signal to the clock generation circuit, and
the clock generation circuit is configured to adjust phases of the first, second, third, and fourth clock signals based on the control signal, such that the phase-adjusted first, second, third, and fourth clock signals are in synchronization with the data signal.

13. The receiving device according to claim 8, wherein the detection circuit is configured to supply the control signal to the phase shifter circuit, and
the phase shifter circuit is configured to adjust phases of the first, second, third, and fourth clock signals based on the control signal indicating the phase lock error, such that the phase-adjusted first, second, third, and fourth clock signals are in synchronization with the data signal.

14. The receiving device according to claim 8, further comprising:
a front end circuit configured to receive the data signal from a transmission device and supply the received data signal to the first, second, third, and fourth samplers, wherein
the detection circuit is configured to supply the control signal to the front end circuit to cause the front end circuit to adjust a phase of the data signal so as to be in synchronization with the first, second, third, and fourth clock signals.

15. The receiving device according to claim 8, wherein the detection circuit is configured to supply the control signal to a transmission device that transmits the data signal to cause the transmission device to adjust a phase of the data signal so as to be in synchronization with the first, second, third, and fourth clock signals.

16. The receiving device according to claim 8, wherein the phase shifter circuit is configured to perform the phase-shift with respect to the second and fourth clock signals, such that the phase of the fourth clock signal is between a phase of the second clock signal and the phase of the third clock signal.

17. The receiving device according to claim 16, wherein the phase shifter circuit is configured to perform the phase-shift with respect to the second and fourth clock signals, such that a phase different between the first clock signal and the second clock signal is decreased.

18. The receiving device according to claim 8, wherein
a phase difference between the first clock signal and the third clock signal that are generated by the clock generation circuit is 180 degree, and
a phase difference between the second clock signal and the fourth clock signal that are generated by the clock generation circuit is 180 degree.

19. The receiving device according to claim 18, wherein a phase difference between the first clock signal and the third clock signal after the phase-shift performed by the phase shifter circuit is 180 degree.

20. The receiving device according to claim 8, wherein
the first and third clock signals have phases for edge sampling of the data signal by the first and third samplers, respectively, and
the second and fourth clock signals have phases for data sampling of the data signal by the second and fourth samplers, respectively.

* * * * *